United States Patent [19]

Saitoh et al.

[11] Patent Number: 5,184,162
[45] Date of Patent: Feb. 2, 1993

[54] TESTING INTEGRATED CIRCUIT USING AN A/D CONVERTER BUILT IN A SEMICONDUCTOR CHIP

[75] Inventors: Kouji Saitoh; Kazuyuki Uchida, both of Yokohama, Japan

[73] Assignee: Kabushiki Kaisha Toshiba, Kawasaki, Japan

[21] Appl. No.: 747,333

[22] Filed: Aug. 20, 1991

[30] Foreign Application Priority Data

Aug. 21, 1990 [JP] Japan ................................ 2-219621

[51] Int. Cl.⁵ .......................................... G01R 31/28
[52] U.S. Cl. ................................ 324/158 R; 371/22.5
[58] Field of Search ................. 324/158 R, 115, 99 D, 324/73.1; 371/22.1, 22.5, 22.6

[56] References Cited

U.S. PATENT DOCUMENTS 4,789,824 12/1988 Henkelmann .................... 324/99 D

OTHER PUBLICATIONS

Duncan, "A BiST Design Methodology Experiment", 1989 International Test Conference, 1989 IEEE, Paper 33.3, pp. 755-762.

Primary Examiner—Ernest F. Karlsen
Attorney, Agent, or Firm—Finnegan, Henderson, Farabow, Garrett and Dunner

[57] ABSTRACT

A testing integrated circuit using an A/D converter provided in an integrated circuit on a semiconductor chip. A selector is provided for selecting either an external signal supplied from an external portion of the chip or an internal signal generated by an internal circuit of the chip, and for outputting the selected signal. The A/D converter, which receives an output from the selector, is normally used for A/D-converting an external signal. During reliability test, the A/D converter receives a signal to measure a voltage from the internal portion of the chip, and A/D-converts the received signal. An output pad which transmits the output of the A/D converter to the external portion is also used as a general output pad. The general output pad is employed to A/D-convert the external signal.

7 Claims, 3 Drawing Sheets

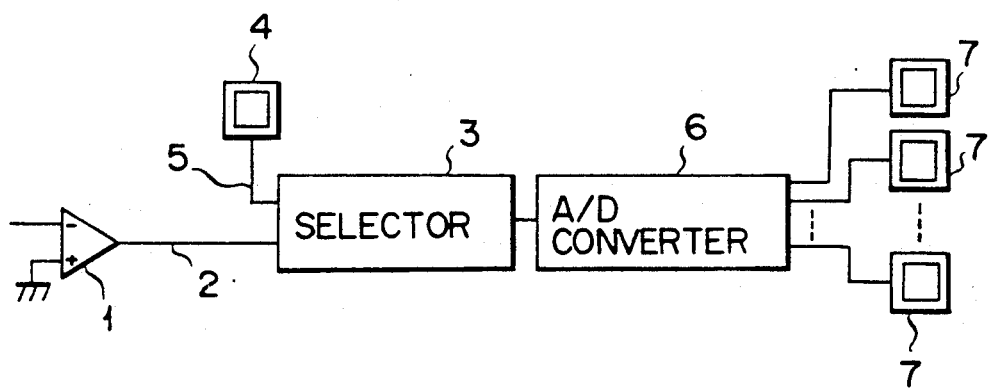
F I G. 2

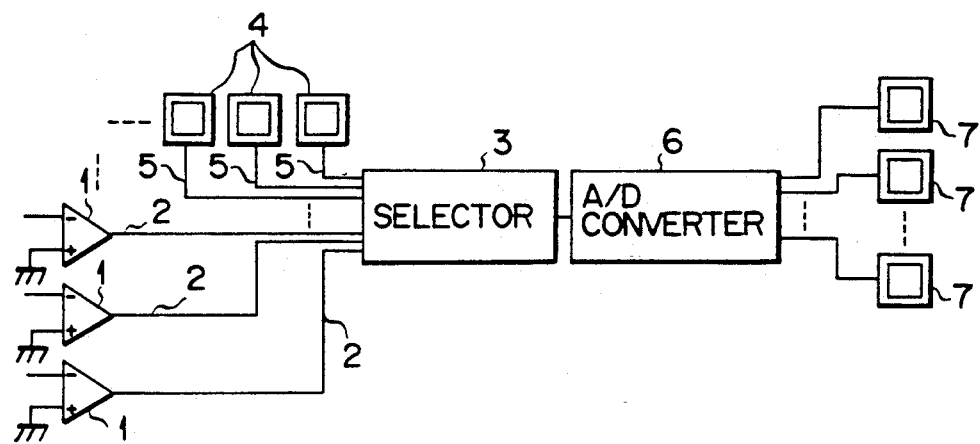
F I G. 3
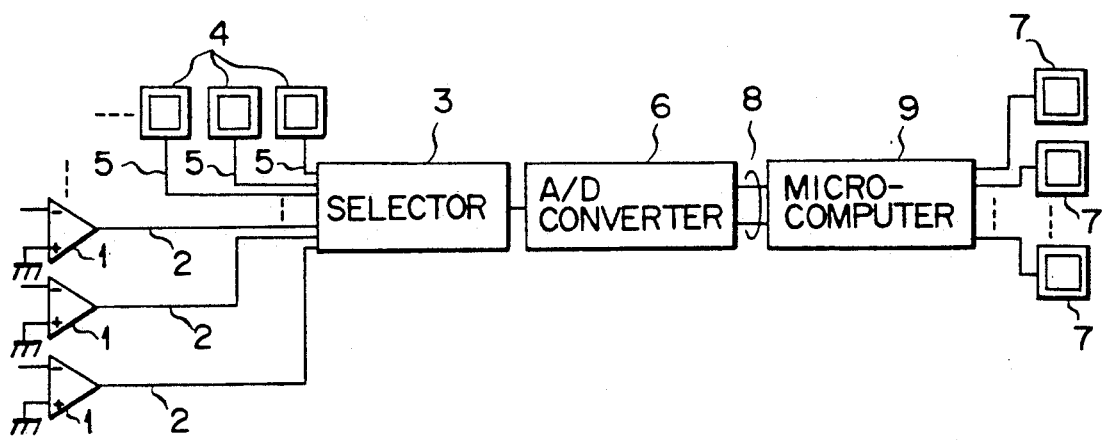
F I G. 4

TESTING INTEGRATED CIRCUIT USING AN A/D CONVERTER BUILT IN A SEMICONDUCTOR CHIP

BACKGROUND OF THE INVENTION

1. Field of the Invention

The present invention relates to a testing integrated circuit for measuring an output voltage of an analog circuit in an internal circuit of LSI.

2. Description of the Related Art

There are often cases in which a voltage of an internal circuit of LSI must be measured to evaluate the reliability of LSI. For example, the following methods for measuring the voltage of the internal circuit can be considered at the trial manufacture:

FIG. 1 shows a structural view explaining the voltage of the internal circuit of an LSI chip by a testing probe. At the time of the trial manufacture, the surface of the chip is exposed to facilitate the examination and analysis. A small pad 22 is formed on an LSI chip 21 to measure the voltage. The small pad 22 is formed such that a probe can contact thereto in advance. A probe 23 is brought into contact with the small pad 22. A signal is suitably supplied to a pad 24 and an output of an internal circuit 25 is measured by a voltmeter 26 connected to the probe 23. By use of the above-mentioned structure, it is possible to measure the voltage of the target portion at an early stage immediately after a wafer is manufactured.

However, in the above-mentioned measuring method, it is complicated to bring the probe 23 into contact with the small pad 22, and it takes much time to measure the voltage. Moreover, such measurement using the probe 23 cannot be performed after assembly such as packaging. Furthermore, in a case where the small pad 22 is not provided in advance, it becomes very difficult to contact the probe 23 to a wire itself.

At the time of the production of the LSI chip in which the trial manufacture is finished, there is a case in which the voltage of the internal circuit is measured and inspected to discriminate between good products and inferior products. This is a method in which a wire of the circuit to be measured is extended to a bonding pad and voltage is measured from the outside of the pad after assembly. Since this method can be performed during a general product inspection, required time for measurement is reduced. It is possible to perform such measurement before or after packaging. However, a pad for measurement must be provided. There is another cases however, in which a pad for measurement cannot be newly increased in view of the chip layout. In such a case, other pads can be used as a pad for measurement. However, in such a case, an extra burden must be imposed on the design.

In the above two examples, of course, a voltmeter for measuring a voltage must be provided.

Moreover, in recent years, a method had been widely used in which an electron beam is directly incident on the wire on the chip, and a signal is observed by the amount of mobile electrons. This method is excellent in resolution, but improper for voltage (current) measurement.

SUMMARY OF THE INVENTION

An object of the present invention is to provide a semiconductor testing integrated circuit that can accurately measure a voltage of an internal circuit without taking much time.

The above object can be achieved by providing a semiconductor testing integrated circuit including a selector provided in an integrated circuit of a semiconductor chip and selecting either an external signal supplied from an external portion of the chip or an internal signal generated by an internal circuit of the chip, and outputting the selected signal; an A/D converter provided in the integrated circuit, and inputting the signal from the selector; and a plurality of output pads of the semiconductor chip transmitting an output of the A/D converter to the external portion.

According to the present invention, a testing integrated circuit is structured by use of the A/D converter built in the semiconductor chip. A signal selecting circuit, which selects the external signal of the semiconductor chip and the internal signal, is connected to the A/D converter. At the time of testing, the internal signal is input to the A/D converter, and the voltage value of the internal signal is obtained digitally.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing the structure of a first embodiment of the present invention;

FIG. 3 is a circuit diagram showing the structure of a second of the present invention;

FIG. 4 is a circuit diagram showing the structure of a third embodiment of the present invention;

DETAILED DESCRIPTION OF THE PREFERRED EMBODIMENTS

Figure 1:
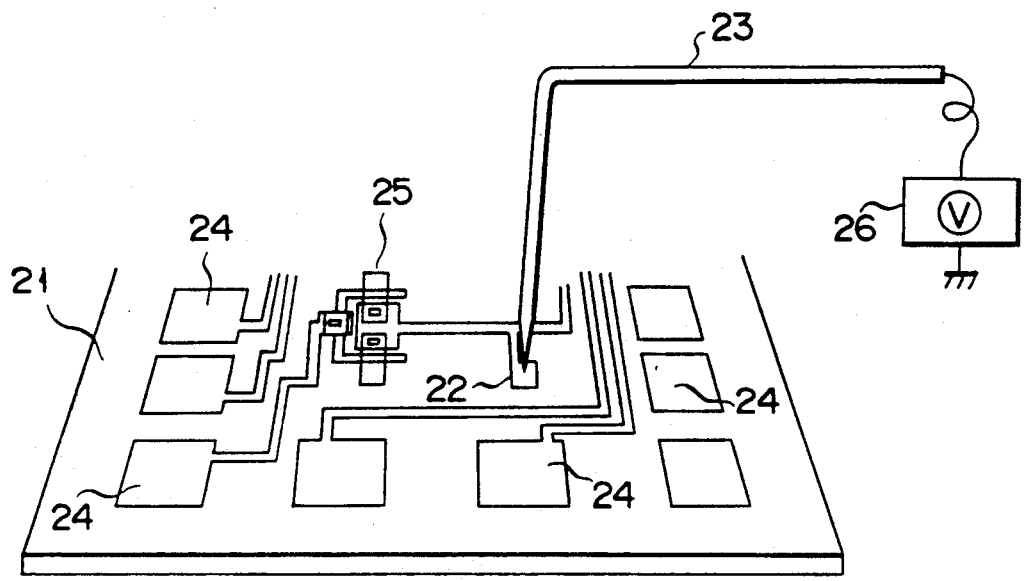
FIG. 1 is a structural view showing a conventional parametric test, which measures a voltage of an internal circuit of an LSI chip by use of a probe.

An LSI is often used in which an A/D converter is provided in an integrated circuit. A signal serving as an input for the A/D converter is generally supplied from an external portion of a chip. However, it is rare that the internal signal of the chip is converted from analog to digital (A/D-converted). According to the present invention, testing integrated circuit is structured, that A/D-converts the internal signal of the chip. The embodiments of the present invention will be explained with reference to the drawings.

FIG. 2 is a circuit diagram showing the structure of the testing integrated circuit formed in the LSI chip according to the first embodiment of the present invention.

An amplifier 1 is provided in the LSI chip, and a signal 2 is output from the amplifier 1. The signal 2 is used to measure a voltage of the internal portion of the chip, and supplied to a selector 3. A signal 5 of the external chip is supplied to the selector 3 from an input pad 4. The selector 3 selects either the signal 2 of the internal circuit or the signal 5 of the external portion of the chip, and supplies the selected signal to an A/D converter 6. In general, the A/D converter 6 inputs the signal 5 from the selector 3. In other words, the converter 6 normally performs original circuit operation.

At the time of SKI reliability test, the input of the A/D converter 6 is changed to receive the signal 2 from the selector 3 to measure the signal. Then, the A/D converter 6 operates to transmit its output to output pads 7, and the result of the A/D conversion is read from the external portion of the chip. It is noted that the number of output pads 7 is provided in accordance with the number of bits of the A/D conversion. The selector 3 may be program-controlled in the internal portion of the chip, or a test mode signal may be supplied thereto from the external portion of the chip.

FIG. 3 is a circuit diagram of the structure showing the second embodiment of the present invention. This embodiment shows a case in which a plurality of signals 2 whose voltages are measured and a plurality of signals 5 are used. The same reference numerals as in FIG. 2 represent the same devices in FIG. 3, and thus, explanation is omitted. The selector 3 selects either the plurality of signals 2 or the plurality of signals 5, and the selected signals are sent to the A/D converter 6. The remaining operations of this embodiment is the same as that of the embodiment of FIG. 2.

FIG. 4 is a circuit diagram of the structure showing the third embodiment of the present invention. This embodiment shows a case in which a microcomputer is mounted on the same chip. The same reference numerals as in FIG. 2 represent the same devices in FIG. 4, and thus, explanation is omitted. A necessary signal process is performed such as a process in which the measuring value, which was A/D-converted by the A/D converter 6, is sent to a microcomputer 9 via an internal data bus 8, and is distributed to each port at a predetermined time series. Thereafter, the signal is output to the external portion from the pad 7. By use of the microcomputer 9, the voltage measurement of one portion is sampled many times, and the signals are equalized, so that noise can be removed. As a result, the voltage of the internal portion of the chip can be measured with high accuracy.

Figure 5:
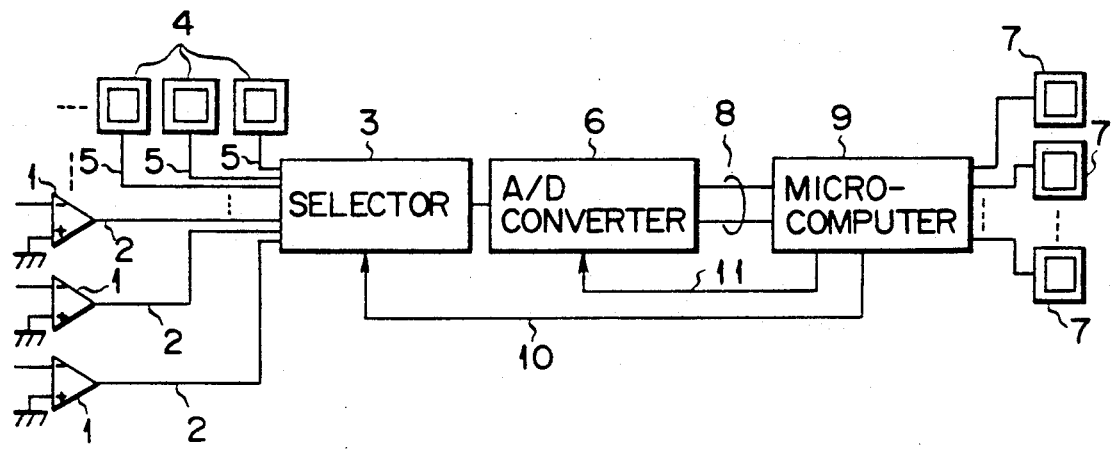
FIG. 5 is a circuit diagram showing the structure of a fourth embodiment of the present invention.

FIG. 5 is a circuit diagram of the structure showing the fourth embodiment of the present invention. Control signals 10 and 11 are respectively sent to the selector 3 and the A/D converter 6 from the microcomputer 9 of FIG. 4. The selector 3 and the converter 6 are respectively program-controlled by the control signals 10 and 11.

Figure 6:
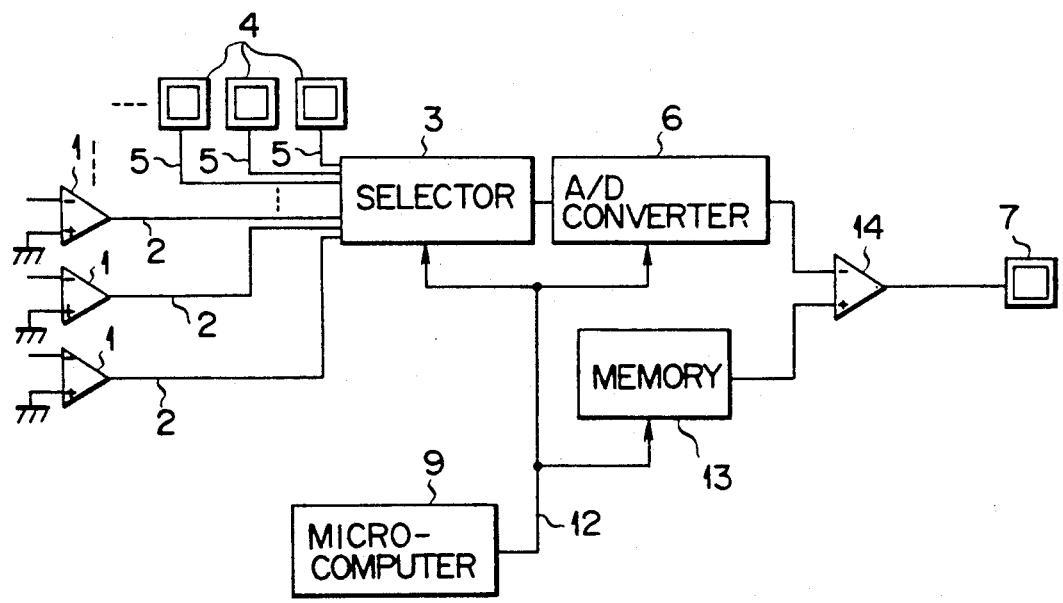
FIG. 6 is a circuit diagram showing the structure of a fifth embodiment of the present invention.

FIG. 6 is a circuit diagram of the structure showing the fifth embodiment of the present invention. The selector 3, the A/D converter 6, and a memory 13, which are provided in the chip, are controlled by a control signal 12 sent from the microcomputer 9 of FIG. 4. Further, a comparator 14 is provided that compares the output of the memory 13 with that of the A/D converter 6. The output of the comparator 14 is fetched from the output pad 7.

Therefore, if the A/D converter is controlled by the microcomputer 9 in measuring the voltage, this invention can be applied to not only the parametric test of the chip but also self-diagnostic of the internal circuit after the circuit is shipped as a product. For example, an expectation value is stored in the memory 13 in advance, and the measured value of the internal circuit and the expectation value are compared with each other by the comparator 14. Thus, if the two values are different, then an abnormal state can be determined.

According to the above-mentioned embodiments, there is no need for the measuring probes the operation of which is complicated in measuring the voltage of the internal circuit on the LSI chip. Therefore, time needed for measuring is greatly reduced. Furthermore, it is possible to measure the voltage of the internal circuit by the signal sent from the external portion even when the chip has been packaged and the surface of the chip is completely covered. Moreover, it is unnecessary to prepare the pad for taking the voltage measurement outside of the chip. Regarding the measuring method, only the output value of the A/D converter need be read, and there is no need for a new pad, which is used only for the voltage measurement.

Moreover, according to the present invention, since voltage measuring means is provided in the internal portion on the LSI chip, it is unnecessary to specially prepare a measuring device (voltmeter) outside of the chip. Also, the measured voltage result of the internal circuit on the LSI chip can be obtained digitally. Therefore, if suitable signal processing means such as a microcomputer is used, the storage of the measured value and signal processing can be easily performed. As a result, various LSI reliability tests can be realized. For example, it is possible to store the measured result in the memory and read out the result as necessary. Also, the measured result can be sampled many times, which is helpful to prevent erroneous measurement from being made due to of noise.

The testing integrated circuit of the present invention is not limited to a testing integrated circuit of a semiconductor chip. As shown in FIG. 6, the design value and the measured value are compared with each other in advance, therefore voltage measurement of the internal circuit can be used to the original circuit operation.

As mentioned above, according to the present invention, the voltage of the internal circuit on the semiconductor chip can be obtained in the form of the digital value by use of the A/D converter built in the chip. Hence, there is no need of a measuring device in the outside of the chip. Moreover, there is no need of a new pad, which is used only for the voltage measurement. Therefore, a semiconductor testing integrated circuit can be provided that can accurately measure a voltage of an internal circuit without taking much time.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A testing integrated circuit comprising:
   selecting means, provided in an integrated circuit of a semiconductor chip, for selecting one of a first signal supplied from an external portion of said semiconductor chip and a second signal used for measuring voltage at a predetermined portion in an internal circuit of said semiconductor chip, said first signal being converted from analog to digital during normal operation of said semiconductor chip;

an analog to digital converter provided in said integrated circuit, said analog to digital converter receiving an analog signal output from said selecting means and producing a digital output; and a plurality of output pads disposed in said semiconductor chip, said output pads transmitting said digital output from said analog to digital converter to said external portion, said output pads corresponding to a bit quantity of said analog to digital converter.

2. The testing integrated circuit according to claim 1, wherein said selecting means normally sets the first signal to be input to said analog to digital converter.

3. The test integrated circuit according to claim 1, wherein said selecting means is controlled by said second signal from the internal portion of said semiconductor chip.

4. The testing integrated circuit according to claim 1, wherein said selecting means is controlled by said first signal from the external portion of said chip.

5. A testing integrated circuit using an analog to digital converter included in to an integrated circuit of a semiconductor chip, comprising:

an input pad formed on a surface of said semiconductor chip for applying an external signal to said analog to digital converter during normal operation;

an amplifier formed on said semiconductor chip for applying a test mode signal to measure voltage at a predetermined portion in said semiconductor chip;

selecting means for selecting one of said external signal and said test mode signal, said external signal being a signal for normal operation of the semiconductor chip and said test mode signal being a signal for testing the semiconductor chip, said selecting means transmitting the selected signal to said analog to digital converter; and a plurality of output pads disposed in said semiconductor chip, said output pads transmitting output of said analog to digital converter to said external portion, said output pads corresponding to a bit quantity of said analog digital converter.

6. The testing integrated circuit according to claim 5, wherein said selecting means is controlled by an internal signal of said semiconductor chip.

7. The testing integrated circuit according to claim 5, wherein said selecting means is controlled by an external signal of said semiconductor chip.

* * * * *

UNITED STATES PATENT AND TRADEMARK OFFICE
CERTIFICATE OF CORRECTION

PATENT NO. :     5,184,162
DATED      :     February 02, 1993
INVENTOR(S):     Kouji Saitoh et al.

It is certified that error appears in the above-identified patent and that said Letters Patent is hereby corrected as shown below:

Claim 3, column 5, line 22, change "test" to --testing--.

Signed and Sealed this

Fourth Day of October, 1994

Attest:

BRUCE LEHMAN

Attesting Officer    Commissioner of Patents and Trademarks